United States Patent [19]
Marzi et al.

[11] Patent Number: 5,111,354
[45] Date of Patent: May 5, 1992

[54] PROCESS FOR THE PERFECTING OF THE GROUNDING OF MULTI-LAYER INSULATIONS (THERMAL BLANKETS) FOR SPACE APPLICATIONS

[75] Inventors: Danilo Marzi, L'Aquila, Italy; Roger A. Stonier, Reno, Nev.

[73] Assignee: Selenia Spazio, S.p.A., L'Aquila, Italy

[21] Appl. No.: 502,434

[22] Filed: Mar. 30, 1990

[30] Foreign Application Priority Data

Apr. 3, 1989 [IT] Italy .................. 47808 A/89

[51] Int. Cl.$^5$ ............................................. H05F 3/02
[52] U.S. Cl. .................... 361/218; 244/1 A; 439/92
[58] Field of Search ............... 439/92, 95; 244/1 A; 361/218, 220

[56] References Cited

U.S. PATENT DOCUMENTS

| | | | |
|---|---|---|---|
| 3,857,994 | 12/1974 | Neale et al. | 439/92 X |
| 4,329,731 | 5/1982 | Meulenberg | 361/218 |
| 4,623,951 | 11/1986 | Du Pont et al. | 361/218 |

*Primary Examiner*—Eugene F. Desmond
*Attorney, Agent, or Firm*—Cohen, Pontani & Lieberman

[57] ABSTRACT

A method and apparatus for grounding multi-layer insulations (MLI) by electric contact, of either of each layer with the other or of all the layers with the underlying structure by means of one or more points of attachment of mechanical type. This makes it possible to simplify the construction procedure and increase the reliability.

This method is essentially carried out in the following manner: The layers (FIG. 1) which form the multi-layer insulations (6), (7) (8) are metalized on both faces and have holes (9) which are also metalized. All layers are contacted with each other and with a part of the attachment system (3) which is also electrically conductive.

The other part of the attachment system (2) is positioned on the structure (1) in such a manner as to permit the passage of electric charges. By contacting the two parts of the attachment system (2) (3), the multi-layer insulation is grounded with the structure.

The invention lies within the technical field of passive thermal protections, especially for space structures (space apparatus and systems etc.).

The object of the invention is to permit the removal of electric charges on multi-layer insulations.

2 Claims, 4 Drawing Sheets

PROCESS FOR THE PERFECTING OF THE GROUNDING OF MULTI-LAYER INSULATIONS (THERMAL BLANKETS) FOR SPACE APPLICATIONS

BACKGROUND OF THE INVENTION

The present invention relates to the field of grounding against the danger of electrostatic discharges (ESD) on multi-layer installations (MLI) used as heat protection of space satellites and structures.

In the course hereof, for convenience, acronyms known to specialists in the field will be used. We will not provide the explicit meanings thereof insofar as they are now accepted in the specific terminology. The grounding system of multi-layer insulations used as thermal protection for satellites and space structures is usually developed in such a manner as to have one or more points of electrical connection with the underlying structure in order to avoid the accumulation of electrostatic charges; these are potential causes of electrostatic discharges (ESD) which may damage or alter the characteristics of the multi-layer insulation itself and may create electrical interference and partially or completely damage the electronic apparatus present on board the space structure.

The present techniques for protection against ESD employ more than one grounding point on each MLI, which points are however, different from the points of attachment of the MLI to the underlying structure.

At each grounding point all the layers which form the multi-layer insulation (the outside one which faces space, the inside one which faces the structure and the intermediate ones) are in contact generally through a metallic material which may be a strip of aluminum sheet or thin washers of metal or of electro-conductive rubber. Another metallic element which may be a strip of metal sheet or a metal cable or wire is therefore used to connect each grounding point of the MLI, either to another grounding point on the contiguous MLI or on the underlying structure or on the structure of the satellite itself.

Such systems of effecting the grounding are complicated and require a large number of points in order to obtain the necessary reliability on each MLI; they are furthermore very laborious to construct and therefore increase the cost of construction, usually adding undesired weight to the MLI and therefore to the satellite or space structure. These problems are solved by the method of grounding which forms the object of the present invention.

BRIEF DESCRIPTION OF INVENTION

Said method provides that each layer of the MLI is in electrical contact with the others and that all the layers are in electrical contact with the underlying structure by one or more points of mechanically attaching the MLI to said underlying structure.

BRIEF DESCRIPTION OF THE DRAWINGS

The invention will now be described with reference to one embodiment which is at present preferred by the inventor, and is indicated by way of illustration and not of limitation with reference to the accompanying drawing in which.

DETAILED DESCRIPTION OF PREFERRED EMBODIMENT

Figure 1:
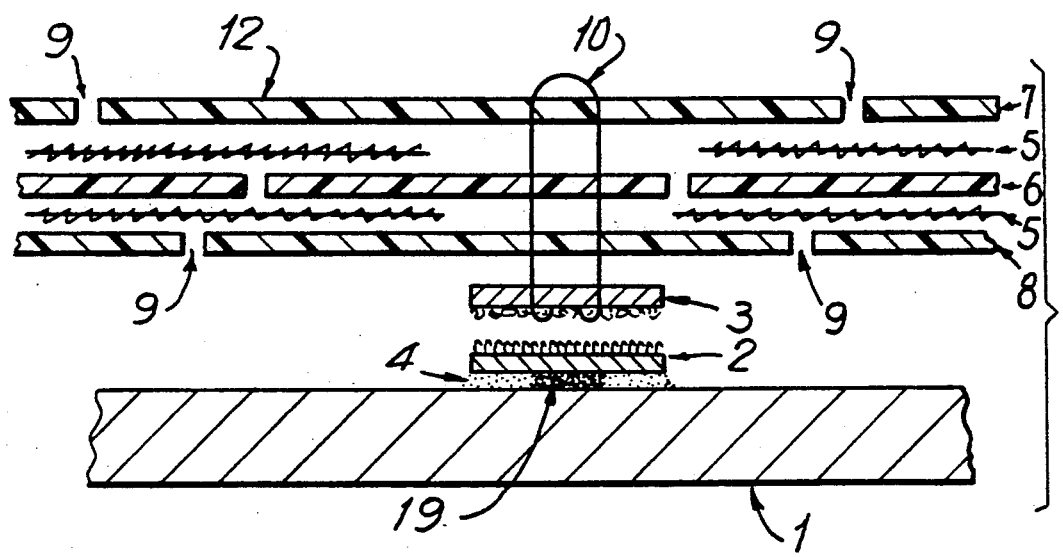
FIG. 1 diagrammatically shows the type of multi-layer insulation in accordance with the present invention.

Returning now to FIG. 1, the preferred means for grounding shown makes it possible to connect a multi-layer insulation 12 electrically to an underlying structure 1 which is also electrically conductive, such as a metallic structure or a composite material with carbon fibers or metal matrix.

This multi-layer insulation 12 is normally used as passive thermal protection on space structures or satellites.

The electrical connection between the multi-layer insulation 12 and the underlying structure 1 is effected by the same system of mechanical attachment as anchors the MLI 12 to the said structure 1. This system of attachment consists in part of hooks 2 and in part of piles 3, of which the attachment system is formed like that of the Velcro LTD system, commonly known by the expression "hook & pile."

Both the hook part 2 and the pile part 3 is made of electrically conductive material such as nylon or polyester metalized with silver, copper or aluminum. The hook element 2 is glued on to the underlying structure 1 using a conductive adhesive 19, which is readily obtainable on the market.

The pile part 3 and the hook part 2 may also be reversed, gluing the pile part 3 on the structure 1 and arranging the hook part 2 on the MLI 12.

Since conductive adhesives do not generally have great adhesive strength, they are preferably not used for structural gluings. Preferably, the conductive adhesive material 19 is used only in the central part of the gluing of the hook part 2 to the underlying structure 1. The outer part of the gluing 4 is effected by the use of a structural adhesive of greater adhesive strength.

Alternatively, the use of a conductive adhesive of satisfactory mechanical properties permits gluing the conductive adhesive alone.

The hook part 2 of the attachment system can be connected to the underlying structure 1 by a metal rivet or a screw or by any type of mechanical and metallic attachment system, whether stationary or removable, or by the combination of a mechanical and an adhesive system.

Figure 2:
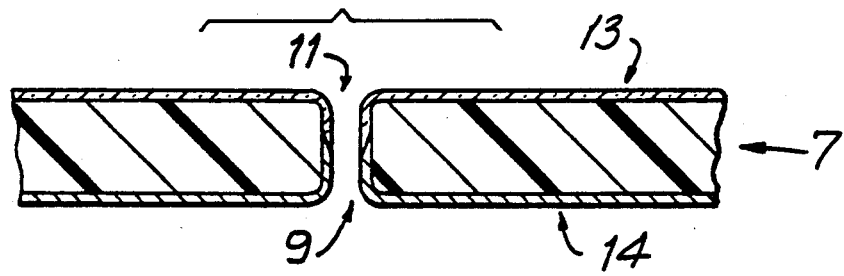
FIG. 2 is an enlarged view of the outer layer of the multi-layer insulation.

The outer layer 7 of the multi-layer insulation 12 must have applied to it a transparent conductive coating 13 such as that formed of ITO (indium tin oxide) or germanium on the outer surface (that facing space) and a vacuum deposited aluminum coating (VDA) 14 on the surface facing the inside (FIG. 2).

Suitable materials with which to produce the outer layer 7 can be a film of polyamides or polyesters or Teflon. Such films are available in various thicknesses with different thermo-optical properties. The outer layer 7 is perforated as by holes 9. The holes 9 are preferably made before the application of the outer conductive coating 13 and of the coating of VDA 14. The size of these holes 9 and their pitch are not critical provided that the number of holes is such as to assure a certain redundance for the system of grounding the multi-layer insulation 12.

The application of the two metal coatings (that of ITO 13 and that of VDA 14) produces an interconnection 11 on the wall of each hole, permitting electrical continuity between the front coated with ITO 13 and the surface facing the inside which is coated with VDA 14.

The presence of these holes, furthermore, performs the function of the removal of the air enclosed between the multi-layer insulation 12 and the underlying structure 1 when, during the launching phase of satellites or space structures, one passes from ambient pressure (760 mm Hg at sea level) to absolute vacuum.

Figure 3:
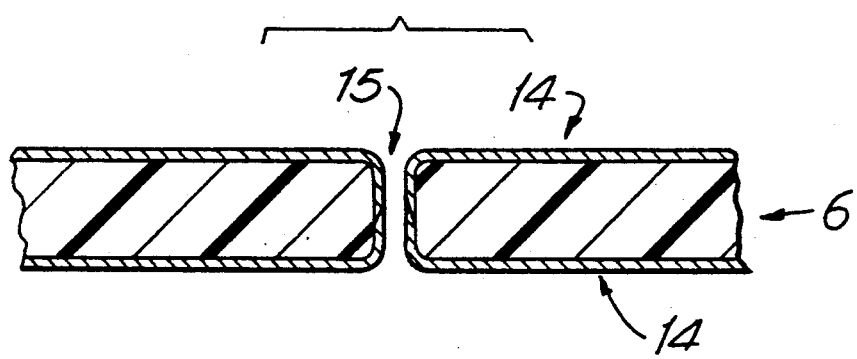
FIG. 3 is an enlarged view of an intermediate layer of the multi-layer insulation.
Figure 4:
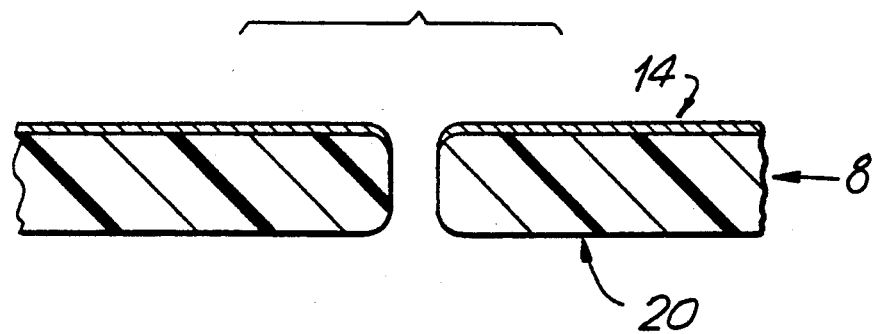
FIG. 4 is an enlarged view of the inner layer of the multi-layer insulation.
Figure 5:
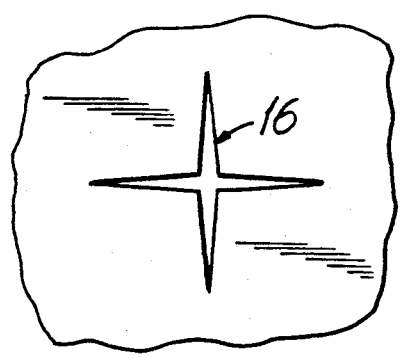
FIG. 5 is a plan view of slit cut made on the multi-layer insulation.
Figure 6:
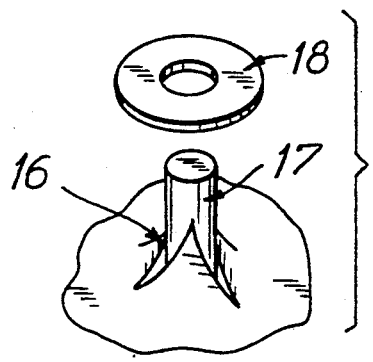
FIG. 6 is an exploded perspective of a metal rivet which penetrates through the slit cut made in the multi-layer insulation, and a washer which will be fastened on the rivet in contact with the multi-layer insulation.
Figure 7:
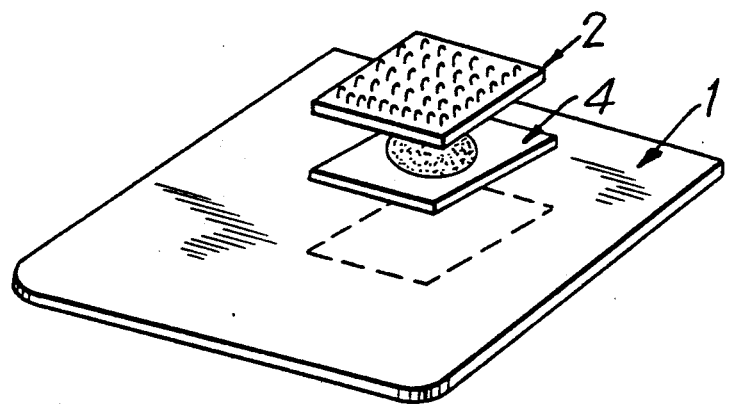
FIG. 7 is an exploded perspective view which shows the technique of gluing, both structural and electric, of half of the mechanical attachment system, with hooks and pile, to the underlying structure.
Figure 8:
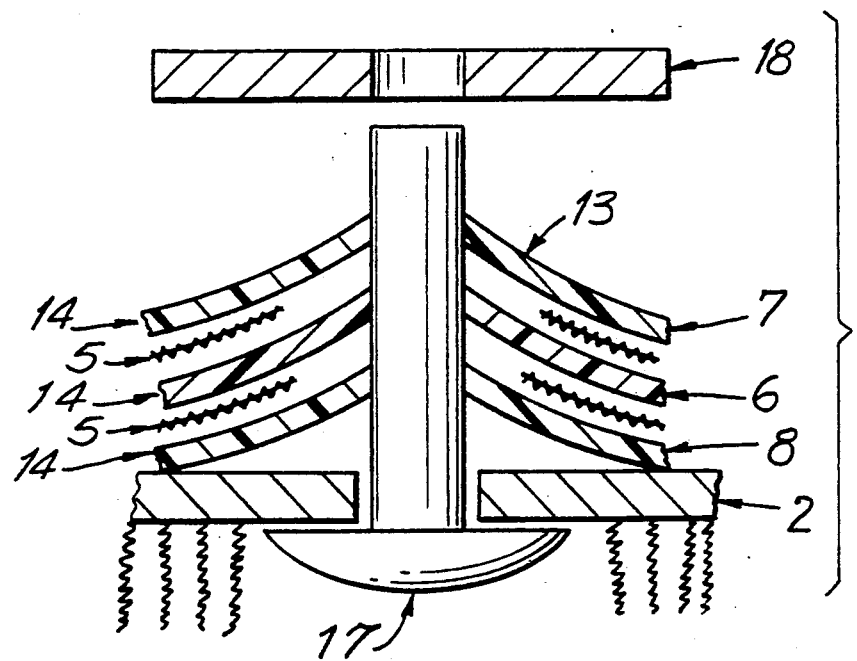
FIG. 8 is an enlarged section of the area of attachment of the MLI, the arrangement of the layers which form the MLI when the electric contact is assured by the rivet and the metallic washer.

The intermediate layers are also made of plastic material, but not necessarily the same material as that of which the outer layer is made, nor necessarily of the same thickness. The intermediate layers 6 have a coating of VDA 14 on both surfaces; they also must have a number of holes 15, interconnected by the deposition after the drilling of the film, of the VDA coating on the wall of the hole, which is sufficiently high to assure the redundance of the total grounding system of the MLI 12 (see FIGS. 3 and 4). Each intermediate layer 6 should not be in contact with the adjacent ones in order to minimize the heat exchanges by conduction which would decrease the efficiency of the MLI 12.

This is obtained by interposing sheets of heat insulation 5, the latter preferably consisting of a light, thin plastic fiber woven in such a manner as to form a network or continuous layer with a plurality of holes.

This thermal insulating function can also be performed by the intermediate layers themselves, if arranged in such a manner as to minimize the areas of mutual contact; this can be obtained by using intermediate layers which are metalized on both surfaces, pleated or made in relief.

This thermal insulation 5, if used, will be eliminated around the point of attachment of the multi-layer insulation 12 to the underlying structure 1 in such a manner that when the layers are compressed together, by a metal clamp 10, a metallic system which may be a rivet 17 with a washer 18, by means of a sewing thread which is also electrically conductive, such as graphite or metal or metalized organic fiber or some combination of such means for compressing, there is electric continuity between the conductive coating of the outer layer 13 and the inner layer 8.

Through the pile part 3 of the hook/pile attachment system, the entire multi-layer insulation 12 can transmit the electrostatic charges to the hook part 2 of the attachment system and therefore, through the conductive adhesive 19 applied between the hook part 2 of the attachment system and the structure 1 it is possible to connect all the layers of the multi-layer insulation 12 to the underlying structure 1 (see FIG. 1). For some multi-layer insulations it may be desirable that the inner layer 8 has the conductive coating of VDA 14 only on the surface which faces the other layers and in such case the electric connection between the outer layer 13 and the outer surface of the inner layer 20 is interrupted.

Since the metal clamp 10 or the conductive wire may not be able to effect sufficient electric contact, use may be made of a metallic or mechanical attachment system 17 which may be a screw or a rivet 17 combined with a washer 18.

This attachment system 17 of mechanical type is in contact with the rear surface of each layer if a cut of slit type 16 is made on each layer and the mechanical attachment element 17 is pushed through this slit 16. When the mechanical attachment system 17 is locked together to the washer 18, the electrical contact will again be assured between the hook part 2 of the hook/pile attachment system and the outer layer 13 (see FIGS. 5, 6, 7, 8). Of course, several mechanical attachment systems 17 and washers 18 may be used if desired.

The present invention describes a method of effecting the grounding of multi-layer insulations assigned to the passive thermal control of satellites or space structures.

In the method presented, each layer of the multi-layer insulation is in electrical contact with the other layers and all the layers are electrically connected with the underlying structure which is also electrically conductive.

The multi-layer insulation is electrically connected to the underlying structure by the said attachment system of the multi-layer insulation of the structure.

It should be understood that the preferred embodiments and examples described are for illustrative purposes only and are not to be construed as limiting the scope of the present invention which is properly delineated only in the appended claims.

What is claimed is:

1. A multi-layer insulation for the passive thermal control of satellites or space structures comprising outer, intermediate and inner superposed layers, the outer layer of the multi-layer insulation (7) being electrically conductive on its two faces (13) (14), said two faces of said outer layer being electrically connected by the presence of holes (9) through said outer layer the walls of which are electrically conductive (11);

both faces of the other layers (6) (8) being electrically conductive, said both faces of each other layer being electrically connected by the presence of holes (9) the walls of which are conductive;

an underlying structure, means for attaching the multi-layer insulation (12) to the underlying structure (1) including a hook and pile fastener (2 and 3) of electrically conductive material;

one part of the hook and pile fastener being electrically conductively attached to the multi-layer insulation (12) and the other part being electrically conductively attached to the underlying structure (1).

2. The multi-layer insulation of claim 1, characterized by the fact that the inner layer (8) is electrically conductive only on one of its surfaces and that on each layer (6), (7), (8) of the multi-layer insulation (12) there extending through said slit cuts, and means (18) for holding said metal element in such a manner as to place the layers of the multi-layer insulation (6), (7), (8) and the hook part (2) or pile part (3) of the attachment system in contact with said metallic element.

* * * * *